United States Patent
Matsuoka

(10) Patent No.: US 7,701,282 B2
(45) Date of Patent: Apr. 20, 2010

(54) OFFSET CANCELING CIRCUIT AND OFFSET CANCELING METHOD

(75) Inventor: Yoshitaka Matsuoka, Tokyo (JP)

(73) Assignee: NEC Corporation, Tokyo (JP)

( * ) Notice: Subject to any disclaimer, the term of this patent is extended or adjusted under 35 U.S.C. 154(b) by 10 days.

(21) Appl. No.: 12/059,348

(22) Filed: Mar. 31, 2008

(65) Prior Publication Data

US 2008/0238547 A1 Oct. 2, 2008

(30) Foreign Application Priority Data

Mar. 30, 2007 (JP) .............................. 2007-094807

(51) Int. Cl.
*H03F 1/02* (2006.01)
(52) U.S. Cl. .......................................................... 330/9
(58) Field of Classification Search ...................... 330/9, 330/259; 327/307
See application file for complete search history.

(56) References Cited

U.S. PATENT DOCUMENTS 7,459,966 B2 * 12/2008 Nakao ............................. 330/9
7,532,065 B2 * 5/2009 Chen et al. .................... 330/9

FOREIGN PATENT DOCUMENTS

| JP | 08223228 A | 8/1996 |
| JP | 2001101872 A | 4/2001 |
| JP | 2003045190 A | 2/2003 |
| JP | 2003259564 A | 9/2003 |
| JP | 2005150789 A | 6/2005 |

* cited by examiner

*Primary Examiner*—Khanh V Nguyen

(57) ABSTRACT

An offset canceling circuit includes a differential amplifier circuit configured to output a first output signal in response to a differential input signal; a latch circuit configured to hold a second output signal determined based on the first output signal; and an offset control circuit configured to supply a reference voltage to the differential amplifier circuit to adjust an offset of the differential amplifier circuit. The second output signal is a binary signal, and the latch circuit changes a signal level of the second output signal based on the first output signal. The offset control circuit acquires the second output signal from the latch circuit for every predetermined time and updates a voltage value of the reference voltage based on the signal levels of two of the second output signals which are acquired continuously in time series.

8 Claims, 4 Drawing Sheets

Fig. 4

| SEL | SET | SO | LO |
|---|---|---|---|
| 0 | X | 0 | 0 |
| 0 | X | 1 | 1 |
| 1 | 1 | X | 0 |
| 1 | 1 | X | 1 |

| $LO_n$ | $LO_{n-1}$ | OS | HLD | REF |
|---|---|---|---|---|
| X | X | 0 | 0 | $REF_{n-1}$ |
| X | X | 1 | 0 | $REF_n$ |
| 0 | 0 | ↑ | 0 | $REF_{n-1}+Voff$ |
| 0 | 1 | ↑ | 0 | $REF_{n-1}$ |
| 1 | 0 | ↑ | 0 | $REF_{n-1}$ |
| 1 | 1 | ↑ | 0 | $REF_{n-1}-Voff$ |
| X | X | X | 1 | $REF_{n-1}$ |

※X 0or1

OFFSET CANCELING CIRCUIT AND OFFSET CANCELING METHOD

This Patent Application is based on Japanese Patent Application No. 2007-094807 filed Mar. 30, 2007. The disclosure of the Japanese Patent Application is incorporated herein by reference.

TECHNICAL FIELD

The present invention relates to offset adjustment of a differential amplifier circuit, and more specifically, to offset adjustment of a differential amplifier circuit that has an offset adjusting terminal.

BACKGROUND ART

Through realization of high-speed transmission of networks and improvement of processing capability of processors, it is required in theses days to process a larger amount of data at a higher speed. Therefore, attention is focused on high-speed serial transmission as an input/output interface that can provide a higher transmission rate.

In order to shorten rising and falling times of a signal, a low voltage differential signaling (LVDS) technique is employed, in which an input/output signal has a small amplitude. However, a noise margin reduces if the amplitude is simply made smaller. The signal is transmitted as a differential signal to eliminate a problem due to the reduction of the noise margin.

The improvement of operation speed of the input/output interface is further strongly demanded, and the amplitude in the differential signal is made smaller and smaller. Meanwhile, due to manufacture variations in impurity concentration and in size accompanied by miniaturization of an LSI, variations have become significant in differential amplifier circuit for amplifying the differential signal. That is, variation in an offset voltage of the differential amplifier circuit has become significant. Such a variation in the offset voltage affects large influence to the differential signal of a small amplitude, to deteriorate transmission quality. Therefore, it is strongly demanded to cancel the variation in the offset voltage to suppress the deterioration of the transmission quality.

However, in an offset canceling control method in related arts, a current value flowing through a differential amplifier circuit and an output signal voltage of the differential amplifier circuit are measured and taken into an offset control circuit. The offset control circuit generates an offset cancellation signal based on the measured result and outputs it to the differential amplifier circuit to cancel the offset. However, the current value and the output signal voltage in the differential amplifier circuit change depending on environmental factors such as noise and ambient temperature. Thus, the control thereof is difficult, so that it is difficult to resolve the above problem of the offset voltage.

In addition to the above description, as for a differential amplifier circuit, Japanese Patent Application Publications (JP-P2001-101872A, JP-P2003-045190A, JP-P2003-259564A, JP-P2005-150789A and JP-A-Heisei 8-223228) are known.

SUMMARY

Therefore, an object of the present invention is to provide an offset canceling circuit and an offset canceling method, in which an offset voltage or an offset current in a differential amplifier circuit can be cancelled in high precision.

In an exemplary embodiment of the present invention, an offset canceling circuit includes a differential amplifier circuit configured to output a first output signal in response to a differential input signal; a latch circuit configured to hold a second output signal determined based on the first output signal; and an offset control circuit configured to supply a reference voltage to the differential amplifier circuit to adjust an offset of the differential amplifier circuit. The second output signal is a binary signal, and the latch circuit changes a signal level of the second output signal based on the first output signal. The offset control circuit acquires the second output signal from the latch circuit for every predetermined time and updates a voltage value of the reference voltage based on the signal levels of two of the second output signals which are acquired continuously in time series.

In another exemplary embodiment of the present invention, a method of canceling an offset includes amplifying a differential input signal by a differential amplifier circuit to output a first output signal; holding a second output signal determined based on the first output signal, wherein the second output signal is a binary signal; controlling a voltage level of a reference voltage based on the second output signal; and supplying the reference voltage to the differential amplifier circuit to adjust an offset of the differential amplifier circuit.

BRIEF DESCRIPTION OF THE DRAWINGS

The above and other objects, advantages and features of the present invention will be more apparent from the following description of certain exemplary embodiments taken in conjunction with the accompanying drawings, in which:

FIG. 4 is a diagram showing an example of a truth table for defining transitions of output signal in the exemplary embodiment of the present invention; and FIG. 5 is a diagram showing an example of a truth table for defining update of an offset cancellation signal according to the exemplary embodiment of the present invention.

EXEMPLARY EMBODIMENTS

Figure 1:
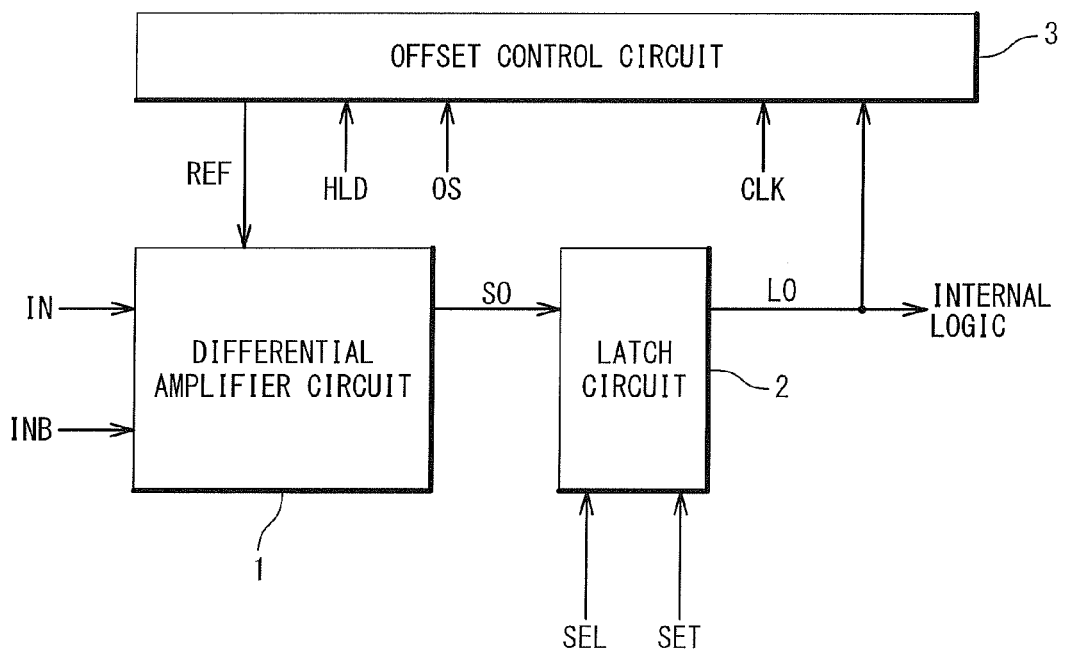
FIG. 1 is a block diagram showing a configuration of the offset canceling circuit 10 according to an exemplary embodiment of the present invention.

Hereinafter, an offset canceling circuit according to exemplary embodiments of the present invention will be described with reference to the attached drawings. The same or similar reference numerals used in the drawings indicate same or similar components.

FIG. 1 is a block diagram showing a configuration of the offset canceling circuit 10 according to an exemplary embodiment of the present invention. Referring to FIG. 1, the offset canceling circuit 10 includes a differential amplifier circuit 1, a latch circuit 2, and an offset control circuit 3. The differential amplifier circuit 1 outputs an output signal SO to the latch circuit 2 in accordance with a differential input signal of a non-inversion input signal IN and an inversion input signal INB. The latch circuit 2 holds the output signal SO as an output signal LO of a binary signal. The offset control circuit 3 outputs an offset canceling signal REF for canceling an offset voltage of the differential amplifier circuit 1 to the differential amplifier circuit 1 based on the output signal LO held by the latch circuit 2.

The latch circuit 2 sets a signal level of the output signal LO to a high level or a low level in response to a switching signal SEL and an initial setting signal SET. More specifically, a mode is switched between an initial setting mode and an offset detection mode in accordance with the switching signal SEL. In the initial setting mode, the latch circuit 2 sets the signal level of the output signal LO to the high level or the low level as the initial setting in accordance with the signal level of the initial setting signal. Further, when a voltage of the output signal SO is higher than a predetermined threshold value, the signal level of the output signal LO is set to the high level. Meanwhile, when it is lower than the threshold value, the signal level is set to the low level.

It is preferable that the latch circuit 2 includes a logic circuit for determining the signal level of the output signal LO based on a truth table. FIG. 4 is the truth table that shows relation of the switching signal SEL, the initial setting signal SET, the signal level of the input signal SO to the latch circuit 2, and the signal level of the output signal LO. An example for setting the signal level of the output signal LO will be described with reference to FIG. 4.

When the switching signal SEL inputted to the latch circuit 2 is "1", i.e. in the high level, the mode is switched to the initial setting mode, and the signal level of the output signal LO is determined in accordance with the signal level of the initial setting signal SET supplied to the latch circuit 2. In this case, when the initial setting signal SET is "0", i.e. in the low level, the latch circuit 2 sets the output signal LO to "0" (the low level). Further, when the initial setting signal SET is "1", i.e. in the high level, the latch circuit 2 sets the output signal LO to "1" (the high level). In the meantime, when the switching signal SEL supplied to the latch circuit 2 is "0", i.e. in the low level, the mode is switched to an offset detection mode, and the signal level of the output signal LO is determined in accordance with the voltage level of the input signal SO supplied to the latch circuit 2. In this case, it is supposed that when the voltage level of the input signal SO is higher than a predetermined threshold value, the signal level of the output signal SO is "1" and when the voltage value of the input signal SO is lower than the threshold value, the input signal SO is "0". In such a case, when the output signal SO is "0", the latch circuit 2 outputs the output signal LO of "0" (the low level). Also, when the output signal SO is "1", the latch circuit 2 outputs the output signal LO of "1" (the high level).

The offset control circuit 3 holds a voltage level of the offset canceling signal REF in response to a hold signal HLD, and updates the signal level of the offset canceling signal REF in response to an input strobe signal OS. When updating the offset canceling signal REF, the offset control circuit 3 obtains from the latch circuit 2, the output signal LO when the non-inversion input signal IN and the inversion input signal INB supplied to the differential amplifier circuit 1 have a same voltage. The offset control circuit 3 updates the signal level of the offset canceling signal REF outputted to the differential amplifier circuit 1 based on the signal level of the output signal LO. At this time, the offset control circuit 3 determines an update value of the offset canceling signal REF in accordance with a combination of the signal level of the output signal LO (output signal $LO_n$) and that of the previous output signal LO (output signal $LO_{n-1}$). The offset control circuit 3 updates the offset canceling signal REF by adding/subtracting a predetermined offset voltage Voff to/from the voltage level of the offset canceling signal REF that has been outputted currently, or by holding the current voltage level.

It is preferable that the offset control circuit 3 includes a logic circuit for determining an update value of the offset canceling signal REF based on a truth table. FIG. 5 shows the truth table that indicates relation of the output signals $LO_n$ and $LO_{n-1}$, the input strobe signal OS, and the hold signal HLD, and the update values of the offset canceling signal REF, and the offset control circuit 3 obtains continuously in time series. An example of a method for determining the update value of the offset canceling signal REF will be described with reference to FIG. 5.

While the hold signal HLD of "1" (the high level) is supplied, the offset control circuit 3 holds an output level of the offset canceling signal $REF_{n-1}$ before being updated, regardless of signal levels of the input strobe signal OS and the output signal LO. When the hold signal HLD is switched to "0" (the low level) and the input strobe signal OS is switched to "1" (the high level), i.e. in response to a rising edge of the input strobe signal OS, the offset control circuit 3 updates the offset canceling signal $REF_{n-1}$ that is outputted, and outputs the offset canceling signal $REF_n$.

The offset control circuit 3 determines the voltage level of the offset canceling signal $REF_n$ based on a combination of the signal level of the output signal $LO_n$ and the signal level of the output signal $LO_{n-1}$. More specifically, when the output signal $LO_n$ and the output signal $LO_{n-1}$ are both "0" (in the low level), the offset control circuit 3 outputs to the differential amplifier circuit 1, the offset canceling signal $REF_n$ that is obtained by adding the offset voltage Voff to the voltage level of the offset canceling signal $REF_{n-1}$. Further, when the output signal $LO_n$ and the output signal $LO_{n-1}$ are both "1" (in the high level), the offset canceling control circuit 3 outputs to the differential amplifier circuit 1, the offset canceling signal $REF_n$ that is obtained by subtracting the offset voltage Voff from the voltage level of the offset canceling signal $REF_{n-1}$. Moreover, when the signal levels of the output signal $LO_n$ and the output signal $LO_{n-1}$ are different, the offset control circuit 3 holds the voltage level of the offset canceling signal $REF_{n-1}$ and outputs it as an update value (the offset canceling signal $REF_n$) to the differential amplifier circuit 1.

Figure 2:
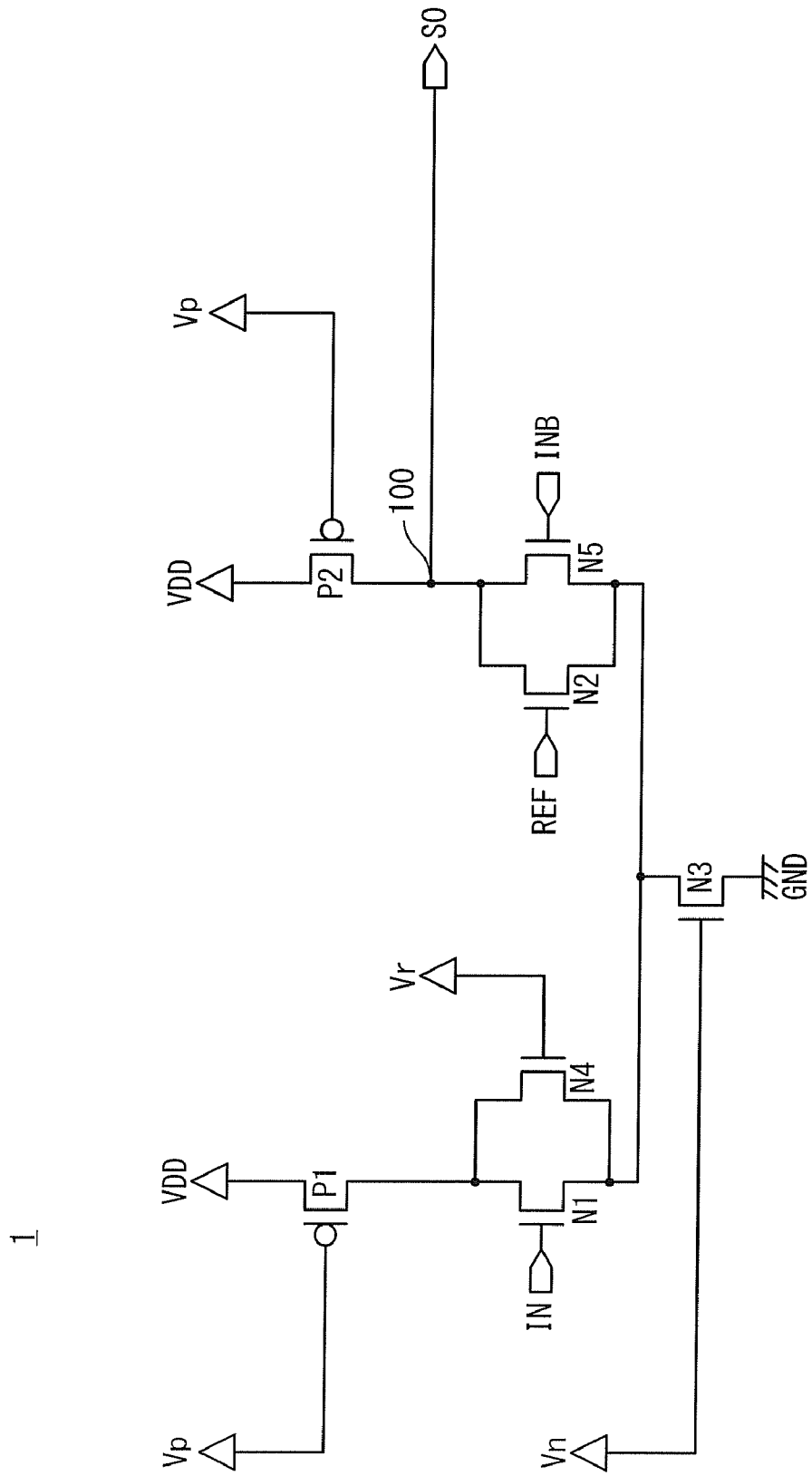
FIG. 2 is a circuit diagram showing a circuit configuration of a differential amplifier circuit according to the exemplary embodiment of the present invention.

Next, the differential amplifier circuit 1 according to the exemplary embodiment of the present invention will be described with reference to FIG. 2. The differential amplifier circuit 1 includes P-channel MOS transistors P1 and P2 whose sources are connected to a first power supply (supply voltage VDD), and N-channel MOS transistors N1, N2, N4, and N5 whose sources are connected to a second power supply (ground voltage GND) via an N-channel type MOS transistor N3. Hereinafter, the P-channel MOS transistors P1 and P2 are simply referred to as transistors P1 and P2, and the N-channel MOS transistors N1 to N5 are referred to as transistors N1 to N5.

The transistor N3 forms a constant-current source together with the second power supply (ground voltage GND), and controls the electric current flowing through the differential amplifier circuit 1 with a bias voltage Vn supplied to its gate. The drain of the transistor N1 is connected to the drain of the transistor P1. Further, the drain of the transistor N5 is connected to the drain of the transistor P2 via an output terminal 100. The non-inversion input signal IN and the inversion input signal INB are supplied to the gates of the transistors N1 and N5, respectively. A constant voltage Vp is supplied to the gates of the transistors P1 and P2. By such a structure, the differential amplifier circuit 1 amplifies a differential input signal (IN−INB), and outputs an output signal SO from an output node 100.

Furthermore, the transistor N4 is connected in parallel with the transistor N1 between a drain of the transistor P1 and the transistor N3. Similarly, the transistor N2 is connected in parallel with the transistor N5 between a drain (output node 100) of the transistor P2 and the transistor N3. A constant voltage Vr is supplied to the gate of the transistor N4, and the offset canceling signal REF is supplied to the gate of the transistor N2. The transistor N2 suppresses an offset voltage generated in the transistor N5, in accordance with the offset canceling signal REF.

Figure 3:
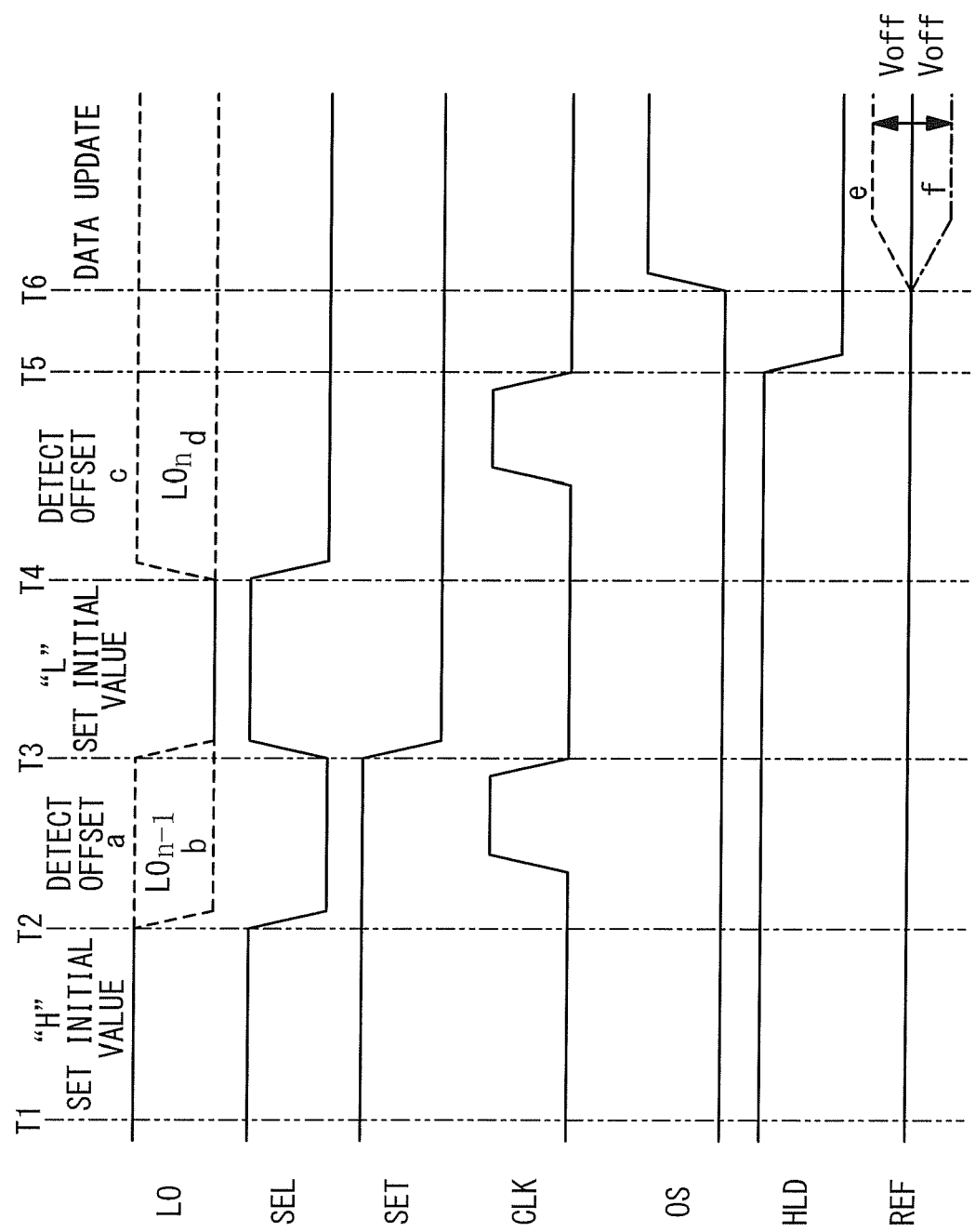
FIG. 3 is a chart showing an operation for updating an offset canceling signal in the offset canceling circuit according to the exemplary embodiment of the present invention.

An operation of the offset canceling circuit 10 will be described with reference to FIGS. 3 to 5. FIG. 3 is timing charts showing the offset canceling operation of the offset canceling circuit 10.

Referring to FIG. 3, the offset canceling circuit 10 cancels the offset voltage of the differential amplifier circuit 1 by repeating an initial setting of the signal level to the high level during time T1 to T2; an offset detection during time T2 to T3; an initial setting of the signal level to the low level during time T3 to T4; an offset detection during time T4 to T5; and data update (updating the signal level of the offset canceling signal) during time T5 to T6. In the present invention, a signal level of the offset canceling signal REF is updated based on the signal level of the output signal LO corresponding to the output signal SO under a state in which the non-inversion input signal IN and the inversion input signal INB are in a same voltage. At this time, the offset canceling circuit 3 obtains the output signal $LO_n$ transited from the high level and the output signal $LO_{n-1}$ transited from the low level, and updates the voltage level of the offset canceling signal REF based on the signal levels of them.

During time T1 to T2, the output signal LO is set to the high level in accordance with the high-level switching signal SEL and the initial setting signal SET. At time T2, the switching signal SEL transits to the low level, so that the mode is switched to the offset detection mode. In the offset detection mode, the signal level of the output signal LO transits to the high level (a) or to the low level (b) in accordance with the signal level of the output signal SO supplied to the latch circuit 2. Then, the offset control circuit 3 obtains as the output signal $LO_{n-1}$, the output signal LO that is offset-detected in response to a clock signal CLK. Here, the output signal $LO_{n-1}$ transited from the high level to the high level or the low level is latched to the offset control circuit 3. The clock signal CLK is synchronous with a differential input signal, and the offset control circuit 3 obtains the output signal $LO_{n-1}$ in accordance with the clock signal that is a signal when the non-inversion input signal IN and the inversion input signal INB are in a same voltage.

Subsequently, after the clock signal CLK is fallen down, i.e. after the output signal $LO_{n-1}$ is taken in, the switching signal SEL transits to the high level and the initial setting signal SET transits to the low level during time T3 to T4. Thereby, the output signal LO is set to the low level. At time T4, the switching signal SEL transits to the low level, so that a mode is switched to the offset detection mode. In the offset detection mode, the signal level of the output signal LO transits to the high level (c) or to the low level (d) in accordance with the signal level of the signal SO supplied to the latch circuit 2. Then, the offset control circuit 3 obtains, as the output signal $LO_n$, the output signal LO that is offset-detected in response to the clock signal CLK. Here, the output signal $LO_n$ transited from the low level to the high level or low level is taken into the offset control circuit 3. The offset control circuit 3 obtains the output signal $LO_n$ in accordance with the clock signal when the non-inversion input signal IN and the inversion input signal INB are in a same voltage, as in case of a duration during time T2 to T3.

During time from time T1 to time T5, the input strobe signal OS is in the low level and the hold signal HLD is in the high level. During this period, the offset control circuit 3 outputs to the differential amplifier circuit 1, the offset canceling signal $REF_{n-1}$ before being updated. After the clock signal CLK is fallen down, i.e. after the output signal $LO_n$ is taken in, the hold signal HLD transits to the low level. Turning to this state, the offset canceling signal REF comes in a state waiting to be updated.

Under the state that the hold signal HLD is in the low level, the offset control section 3 updates the offset canceling signal $REF_{n-1}$ to the offset canceling signal $REF_n$ in response to a rising edge of the input strobe signal OS. Here, the offset control section 3 determines the signal level of the updated offset canceling signal according to the truth table shown in FIG. 5 based on the signal levels of the output signal $LO_{n-1}$ and the output signal $LO_n$. For example, when the output signal $LO_{n-1}$ and the output signal $LO_n$ are both in the high level (a, c), the signal level of the offset canceling signal $REF_n$ becomes the signal level (f) obtained by subtracting the offset voltage Voff from the offset canceling signal $REF_{n-1}$. Meanwhile, when the output signal $LO_{n-1}$ and the output signal $LO_n$ are both in the low level (b, d), the signal level of the offset canceling signal $REF_n$ becomes the signal level (e) that is obtained by adding the offset voltage Voff to the offset canceling signal $REF_{n-1}$. When the signal levels of the output signal $LO_{n-1}$ and the output signal $LO_n$ are different, i.e. (a, d) or (b, c), the voltage level of the offset canceling signal $REF_n$ becomes the same as that of the offset canceling signal $REF_{n-1}$.

The offset of the differential amplifier circuit 2 can be cancelled by repeating the actions described above until when the signal level of the output signal LO does not transit from the initial setting value to the other signal level. With the present invention, it is possible to eliminate influences of a noise since the output signal LO of the latch circuit 2 is a binary signal of the low level and the high level.

Further, the offset canceling circuit 10 according to the exemplary embodiment of the present invention cancels the offset by repeatedly executing observation of the offset by utilizing the output signal SO of the differential amplifier circuit 1, conversion of the detected offset to digital data (output signal LO), and update of the offset canceling signal REF based on the digital data. Therefore, the offset of the differential amplifier circuit 1 can be easily canceled through a digital control.

While the exemplary embodiment of the present invention has been described in detail, it could be understood that specific structures of the present invention are not limited to the foregoing exemplary embodiment only and that various changes and modifications are possible without departing from the spirit and scope thereof. In the present exemplary embodiment, MOS transistors are used for the differential amplifier circuit 1. However, bipolar transistors may be used instead. Further, the signal level of the output signal LO in the present exemplary embodiment transits to the high level when the signal level of the output signal SO is higher than the predetermined threshold value, and transits to the low level when the voltage level is lower than the threshold value. However, the present invention is not limited to this. The signal level of the output signal LO may transit to the low level when the signal level is higher than the predetermined threshold value, and transits to the high level when the signal level is lower. In this case, when the output signal $LO_{n-1}$ and the output signal $LO_n$ are both in the low level, the offset canceling signal REF after being updated comes to have a value that is obtained by subtracting the offset voltage Voff from the offset canceling signal $REF_{n-1}$. When the output signal $LO_{n-1}$ and the output signal $LO_n$ are both in the high level, the offset canceling signal $REF_n$ after being updated comes to have a value that is obtained by adding the offset voltage Voff to the offset canceling signal $REF_{n-1}$.

According to the present invention, it is possible to cancel the offset voltage generated in the differential amplifier circuit in high precision. Also, it is possible to suppress characteristic fluctuations generated in the offset canceling circuit due to external environment. Moreover, it is possible to increase noise resistance of the offset canceling circuit. Further, it is possible to cancel the offset voltage generated in the differential amplifier circuit easily.

While the present invention has been particularly shown and described with reference to the exemplary embodiments thereof, the present invention is not limited to these exemplary embodiments. It will be understood by those of ordinary skill in the art that various changes in form and details may be made therein without departing from the spirit and scope of the present invention as defined by the claims.

What is claimed is:

1. An offset canceling circuit comprising:
   a differential amplifier circuit configured to output a first output signal in response to a differential input signal;
   a latch circuit configured to hold a second output signal determined based on said first output signal; and
   an offset control circuit configured to supply a reference voltage to said differential amplifier circuit to adjust an offset of said differential amplifier circuit,
   wherein said second output signal is a binary signal, and said latch circuit changes a signal level of said second output signal based on said first output signal, and
   said offset control circuit acquires said second output signal from said latch circuit for each of a plurality of predetermined times and updates a voltage value of said reference voltage based on the signal level of said second output signal for at least two of the predetermined times which are acquired continuously in time series,
   wherein said latch circuit changes the signal level of said second output signal based on a comparison result of said first output signal and a threshold level,
   and wherein said offset control circuit holds the voltage level of said reference signal, when the signal level of said second output signal for the at least two of the predetermined times is different, and changes the voltage level of said reference voltage when the signal level of said second output signal for the at least two of the predetermined times is identical.

2. The offset canceling circuit according to claim 1, wherein said latch circuit changes the signal level of said second output signal to a first voltage level when the voltage level of said first output signal is lower than said threshold level, and changes the signal level of said second output signal to a second voltage level when the voltage level of said first output signal is higher than said threshold level, and
   said offset control circuit adds a predetermined voltage to said reference voltage when the signal level said second output signal is the first voltage level for the at least two of the predetermined times, and decreases a predetermined voltage from said reference voltage when the signal level said second output signal is a second voltage level for the at least two of the predetermined times.

3. The offset canceling circuit according to claim 2, wherein said latch circuit changes an initial setting signal level of said second output signal to a high voltage level or a low voltage level based on said first output signal, and
   said offset control circuit acquires said second output signal changed from the high voltage level at a first time of the at least two of the predetermined times and said second output signal changed from the low voltage level at a second time of the at least two of the predetermined times.

4. The offset canceling circuit according to claim 3, wherein said offset control circuit updates the voltage level of said reference voltage based on said second output signal when the voltage level of said differential input signal is 0.

5. A method of canceling an offset comprising:
   amplifying a differential input signal by a differential amplifier circuit to output a first output signal;
   holding a second output signal determined based on said first output signal, wherein said second output signal is a binary signal;
   controlling a voltage level of a reference voltage based on said second output signal; and
   supplying the reference voltage to said differential amplifier circuit to adjust an offset of said differential amplifier circuit,
   wherein said controlling comprises:
     changing a signal level of said second output signal based on said first output signal;
     acquiring said second output signal for each of a plurality of predetermined times; and
     updating the voltage level of said reference voltage based on the signal level of said second output signal for at least two of the predetermined times which are acquired continuously in time series;
   wherein said changing comprises changing the signal level of said second output signal based on a comparison result of said first output signal and a threshold level,
   and wherein said updating comprises:
     keeping the voltage level of said reference voltage level when the signal level of said second output signal is different for the at least two of the predetermined times; and
     updating the voltage level of said reference signal when the signal level of said second output signal is identical for the at least two of the predetermined times.

6. The method according to claim 5, wherein said changing a signal level of said second output signal, comprises:
   changing the signal level of said second output signals to a first voltage level when a voltage level of said first output signal is lower than the threshold level; and
   changing the signal level of said second output signal to a second voltage level when the voltage level of said first output signal is higher than the threshold level, and
   said updating the voltage level of said reference voltage, comprising:
     adding a predetermined voltage to said reference voltage when the signal level of said second output signal is the first voltage level for the at least two of the predetermined times; and
     decreasing the predetermined voltage from said reference voltage when the signal level of said second output signal is the second voltage level for the at least two of the predetermined times.

7. The method according to claim 5, wherein said changing a signal level of said second output signal, comprises:
   changing an initial signal level of said second output signal based on said first output signal,
   said acquiring comprises:
     acquiring said second output signal changed from a high voltage level at a first time of the at least two of the predetermined times and said second output signal changed from a low voltage level at a second time of the at least two of the predetermined times.

8. A method of canceling an offset comprising:

amplifying a differential input signal by a differential amplifier circuit to output a first output signal;

holding a second output signal determined based on said first output signal, wherein said second output signal is a binary signal;

controlling a voltage level of a reference voltage based on said second output signal; and supplying the reference voltage to said differential amplifier circuit to adjust an offset of said differential amplifier circuit, wherein said controlling comprises:

controlling the voltage level of said reference voltage based on said second output signal when said differential input signal is 0.

* * * * *